(12) United States Patent
Furuuchi et al.

(10) Patent No.: US 8,828,125 B2
(45) Date of Patent: Sep. 9, 2014

(54) VENTILATION MEMBER

(75) Inventors: Kouji Furuuchi, Osaka (JP); Youzou Yano, Osaka (JP)

(73) Assignee: Nitto Denko Corporation, Osaka (JP)

(*) Notice: Subject to any disclaimer, the term of this patent is extended or adjusted under 35 U.S.C. 154(b) by 113 days.

(21) Appl. No.: 13/639,379

(22) PCT Filed: Apr. 6, 2011

(86) PCT No.: PCT/JP2011/002055
§ 371 (c)(1),
(2), (4) Date: Oct. 4, 2012

(87) PCT Pub. No.: WO2011/125330
PCT Pub. Date: Oct. 13, 2011

(65) Prior Publication Data
US 2013/0025457 A1    Jan. 31, 2013

(30) Foreign Application Priority Data
Apr. 9, 2010 (JP) .................................. 2010-090805

(51) Int. Cl.
*B01D 53/22* (2006.01)
*B01D 69/10* (2006.01)
*B01D 71/36* (2006.01)
*F21S 8/10* (2006.01)
*F21V 31/03* (2006.01)

(52) U.S. Cl.
CPC ............... *F21V 31/03* (2013.01); *F21S 48/337* (2013.01); *F21S 48/335* (2013.01)
USPC ........ 96/4; 95/45; 55/385.4; 55/521; 362/547

(58) Field of Classification Search
USPC .............. 96/4; 95/45; 55/385.2, 385.4, 385.6, 55/521; 362/547
See application file for complete search history.

(56) References Cited

U.S. PATENT DOCUMENTS 3,854,040 A * 12/1974 Heiderer ....................... 362/547
5,019,140 A * 5/1991 Bowser et al. .................... 96/6
5,108,474 A * 4/1992 Riedy et al. .................. 55/385.4
(Continued)

FOREIGN PATENT DOCUMENTS

JP    3-053377    11/1991
JP    2001-143524    5/2001
(Continued)

Primary Examiner — Jason M Greene
(74) Attorney, Agent, or Firm — Hamre, Schumann, Mueller & Larson, P.C.

(57) ABSTRACT

The ventilation member of the present invention includes a waterproof gas permeable membrane (11), and a support body (12) having a through hole (13). One opening of the through hole (13) is closed by the gas permeable membrane (11). The support body (12) includes, at an edge of the opening closed by the gas permeable membrane (11), a first region and a second region facing each other with the opening located therebetween. A first angled protrusion (12a) in which a peak and a trough are arranged alternately along the edge of the opening is provided in the first region, and a second angled protrusion (12b) in which a peak and a trough are arranged alternately along the edge of the opening is provided in the second region. The gas permeable membrane (11) is joined onto the first angled protrusion (12a) and the second angled protrusion (12b), and has a pleat shape or a wave shape in which a peak and a trough are arranged alternately along shapes of the first angled protrusion (12a) and the second angled protrusion (12b).

9 Claims, 14 Drawing Sheets

(56) References Cited

U.S. PATENT DOCUMENTS

| | | | |
|---|---|---|---|
| 6,284,020 B1* | 9/2001 | Mizuno et al. | 55/385.2 |
| 6,364,924 B1 | 4/2002 | Mashiko et al. | |
| 6,827,232 B1 | 12/2004 | Hara et al. | |
| 8,177,883 B2* | 5/2012 | Jorgensen et al. | 95/45 |
| 8,261,947 B2* | 9/2012 | Erdmann | 96/6 |
| 2008/0092741 A1* | 4/2008 | Furuuchi et al. | 96/9 |
| 2009/0268475 A1* | 10/2009 | Ball et al. | 362/547 |
| 2011/0016836 A1 | 1/2011 | Yano | |

FOREIGN PATENT DOCUMENTS

| | | |
|---|---|---|
| JP | 2001-155814 | 6/2001 |
| WO | 2009/122785 | 10/2009 |
| WO | 2009/131624 | 10/2009 |

* cited by examiner

Y

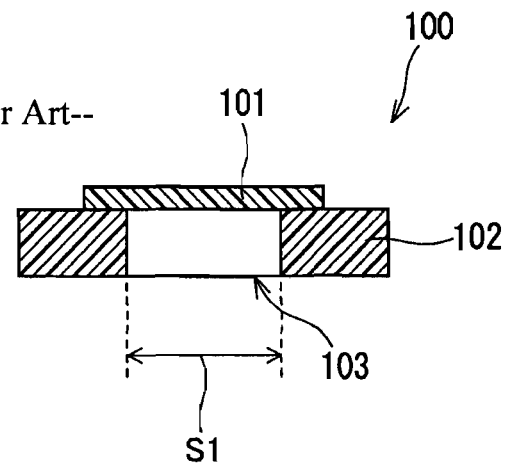
FIG.7A --Prior Art--
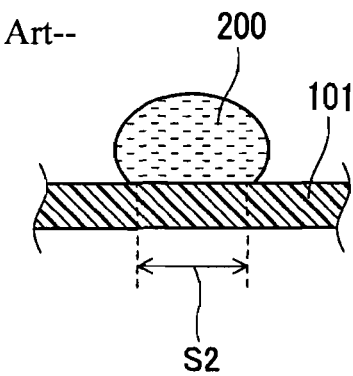
FIG.7B --Prior Art--

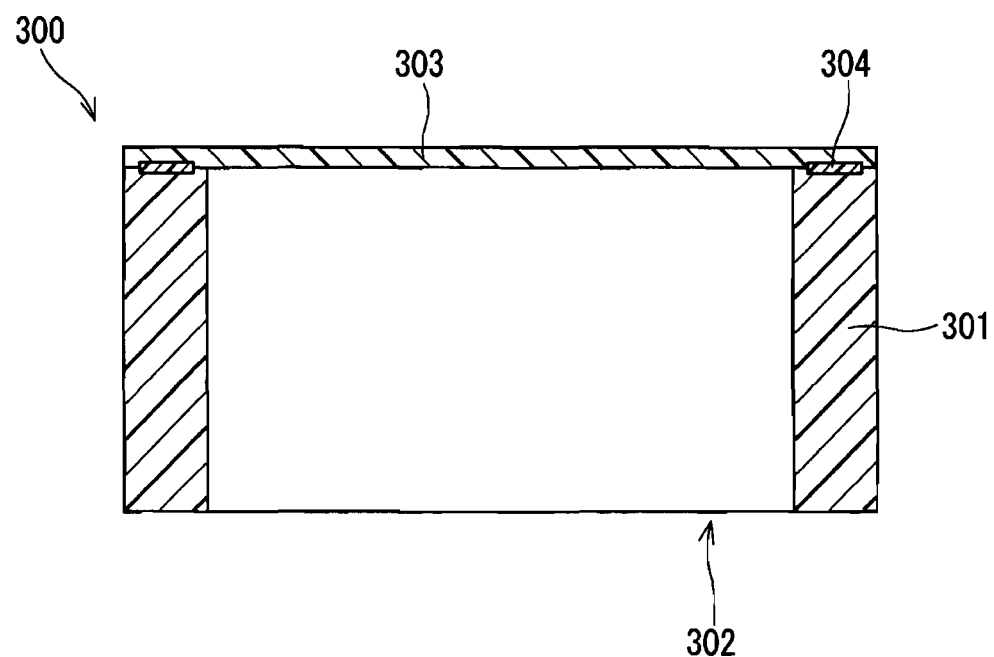
FIG.14 --Prior Art--

VENTILATION MEMBER

TECHNICAL FIELD

The present invention relates to a ventilation member used for adjusting the internal pressure of various housings of, for example, automobile electrical components, such as automobile lamps and ECUs (Electrical Control Units), electric toothbrushes, shavers, and outdoor lighting devices.

BACKGROUND ART

In many cases, various housings of, for example, automobile electrical components, electric toothbrushes, shavers, and outdoor lighting devices are provided with a ventilation hole for the purpose of, for example, preventing deformation and burst of the housings due to temperature difference between inside and outside of the housings. In the case where the housings are provided with a ventilation hole, ventilation members including various waterproof gas permeable membranes are used in order to prevent water and dust from entering into the housings (see Patent Literatures 1 to 3).

For example, Patent Literature 3 discloses a ventilation member fabricated by welding a gas permeable membrane to an approximately cylindrical body (support body) made of a thermoplastic elastomer so as to close one opening of a through hole of the approximately cylindrical body. This ventilation member is fixed to a housing of an electrical component by utilizing the elasticity of the thermoplastic elastomer. Such a ventilation member has excellent productivity because it is fabricated by welding a flat (sheet-like) gas permeable membrane to an elastic body.

Usually, the gas permeable membrane used in a ventilation member has a sheet-like shape. As shown in FIG. 14, a common ventilation member 300 is composed of a support body 301 that is an approximately cylindrical body, and a sheet-like gas permeable membrane 303 provided so as to close one opening of a through hole 302 of the support body 301. The gas permeable membrane 303 is welded to the support body 301 (a welding portion 304) to be joined to the support body 301.

However, in a ventilation member with such a structure, there is a limitation in increasing further the gas permeation quantity because the gas permeable membrane has a sheet-like shape. Moreover, in recent years, hybrid cars and electric automobiles have been used more widely. Ventilation members attached to battery boxes, electrical components, etc. of these automobiles are required to have a further increased permeation quantity.

In components and devices that need internal pressure adjustment, an attachment area in which a ventilation member is to be attached cannot be ensured sufficiently in some cases. Particularly, automobile lamps have a problem in that a lamp lens surface is fogged with water condensation. Thus, a ventilation member with a larger gas permeation quantity needs to be attached in order to evaporate the condensed water quickly. However, since the area in which the ventilation member can be attached is limited, there has been a limitation in achievable gas permeation quantity.

CITATION LIST

Patent Literature

PTL 1: JP 2001-155814 A
PTL 2: JP 3(1991)-53377 Y2
PTL 3: JP 2001-143524 A

SUMMARY OF INVENTION

Technical Problem

The present invention has been accomplished in view of the foregoing problems. An object of the present invention is to provide a ventilation member having a larger gas permeation quantity while including a support body with a through hole that serves as a gas passage and is equivalent to a conventionally-provided through hole, that is, while maintaining an attachment area equivalent to a conventionally-required attachment area.

Solution to Problem

A first ventilation member of the present invention includes:
 a waterproof gas permeable membrane; and
 a support body having a through hole, one opening of the through hole being closed by the gas permeable membrane.

The support body includes, at an edge of the opening closed by the gas permeable membrane, a first region and a second region facing each other with the opening located therebetween.

A first angled protrusion in which a peak and a trough are arranged alternately along the edge of the opening is provided in the first region, and a second angled protrusion in which a peak and a trough are arranged alternately along the edge of the opening is provided in the second region.

The gas permeable membrane is joined onto the first angled protrusion and the second angled protrusion, and has a pleat shape or a wave shape in which a peak and a trough are arranged alternately along shapes of the first angled protrusion and the second angled protrusion.

A second ventilation member of the present invention includes:
 a support body having a through hole; and
 a gas permeable membrane that is disposed inside the through hole, joined to an inner wall surface of the through hole so as to close the through hole, and has a pleat shape or a wave shape.

Advantageous Effects of Invention

The support body of the first ventilation member of the present invention is provided with, at the edge of the opening closed by the gas permeable membrane, the first angled protrusion and the second angled protrusion. Since the first angled protrusion and the second angled protrusion are provided respectively in the first region and the second region facing each other with the opening located therebetween, they face each other with the opening located therebetween. Joined onto the first angled protrusion and the second angled protrusion thus configured, the gas permeable membrane has a pleat shape or wave shape with peaks and troughs. In the first ventilation member of the present invention, since the gas permeable membrane has a pleat shape or wave shape as just described, it is possible to increase a gas permeable area without increasing the attachment area, and thereby to increase the gas permeation quantity.

In the first ventilation member of the present invention, the gas permeable area is larger than that of a ventilation member having a sheet-like gas permeable membrane, and both ends of the troughs of the gas permeable membrane are open. Thus, even when the gas permeable membrane is disposed parallel to a horizontal plane and a water droplet is put thereon, there is, unlike in the case of a sheet-like gas permeable membrane, low possibility of the gas permeable area being covered with the water droplet. Furthermore, the water droplets accumulated at the troughs can flow out from the both ends of the troughs. In this way, the first ventilation member of the present invention can ensure a sufficient gas permeation quantity even when a water droplet is put on the gas permeable membrane.

In the second ventilation member of the present invention, the gas permeable membrane disposed inside the through hole of the support body has a pleat shape or a wave shape. Thus, in the second ventilation member of the present invention, it is possible to increase the gas permeable area without increasing the attachment area, and thereby to increase the gas permeation quantity. Moreover, in the second ventilation member of the present invention, the gas permeable membrane is disposed so as to be accommodated inside the through hole. Therefore, the second ventilation member of the present invention can be reduced further in size while ensuring a large gas permeation quantity.

BRIEF DESCRIPTION OF DRAWINGS

FIG. 7A is a cross-sectional view showing a brief configuration of a conventional ventilation member. FIG. 7B is a cross-sectional view showing a gas permeable membrane of the conventional ventilation member, with a water droplet present thereon.

FIG. 14 is a cross-sectional view showing the structure of a common conventional ventilation member.

DESCRIPTION OF EMBODIMENTS

Hereinafter, embodiments of the ventilation member of the present invention are described in detail with reference to the drawings. The following description does not limit the present invention.

Embodiment 1

Figure 1A:
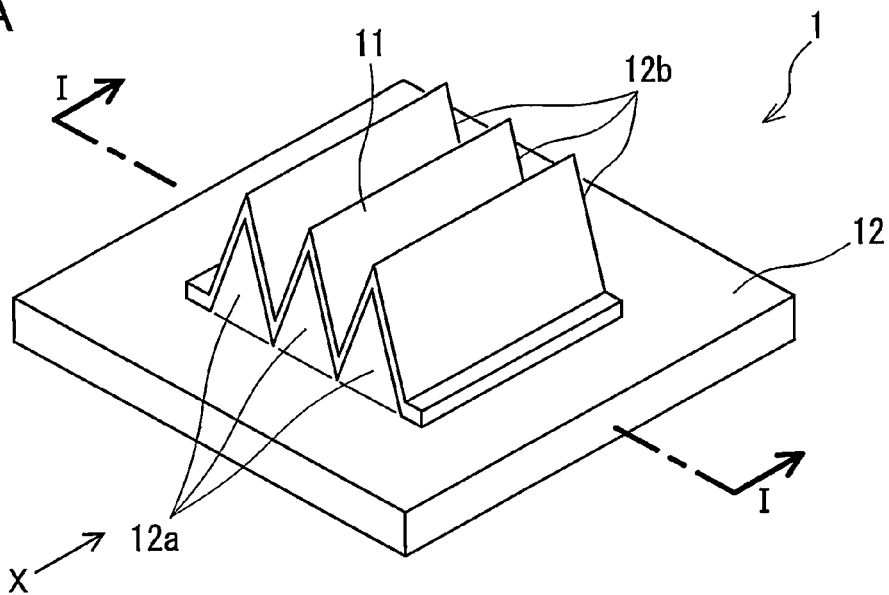
FIG. 1A is a perspective view showing the structure of a ventilation member in Embodiment 1 of the present invention.
Figure 1B:
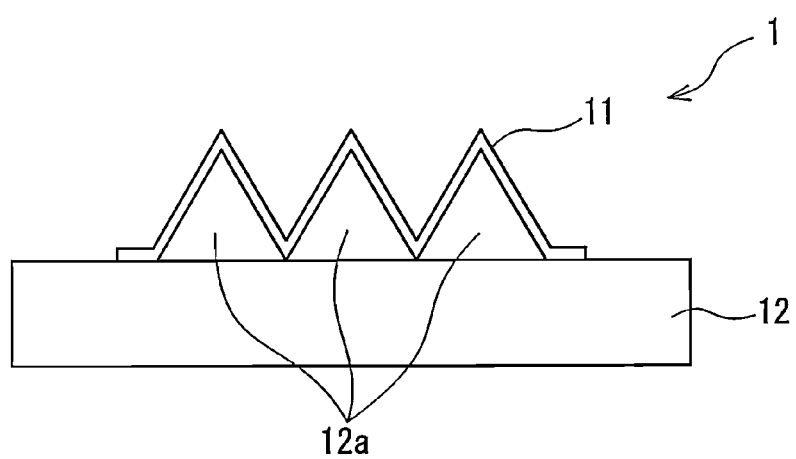
FIG. 1B is a side view of the ventilation member shown in FIG. 1A, viewed from the X direction.
Figure 1C:
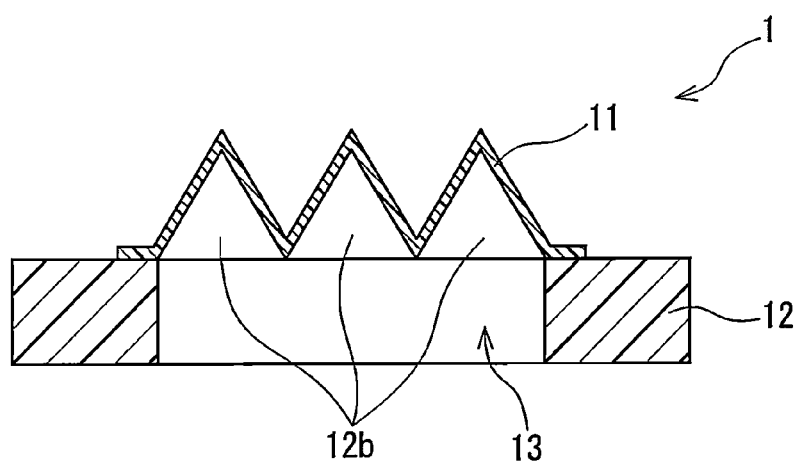
FIG. 1C is a cross-sectional view of FIG. 1A, taken along the line I-I.

FIG. 1A is a perspective view showing the structure of a ventilation member 1 in Embodiment 1 of the present invention. FIG. 1B is a side view of the ventilation member 1 shown in FIG. 1A, viewed from the X direction. FIG. 1C is a cross-sectional view of FIG. 1A, taken along the line I-I.

The ventilation member 1 of the present embodiment includes a waterproof gas permeable membrane 11, and a support body 12 having a through hole 13. One opening of the through hole 13 is closed by the gas permeable membrane 11.

Figure 2A:
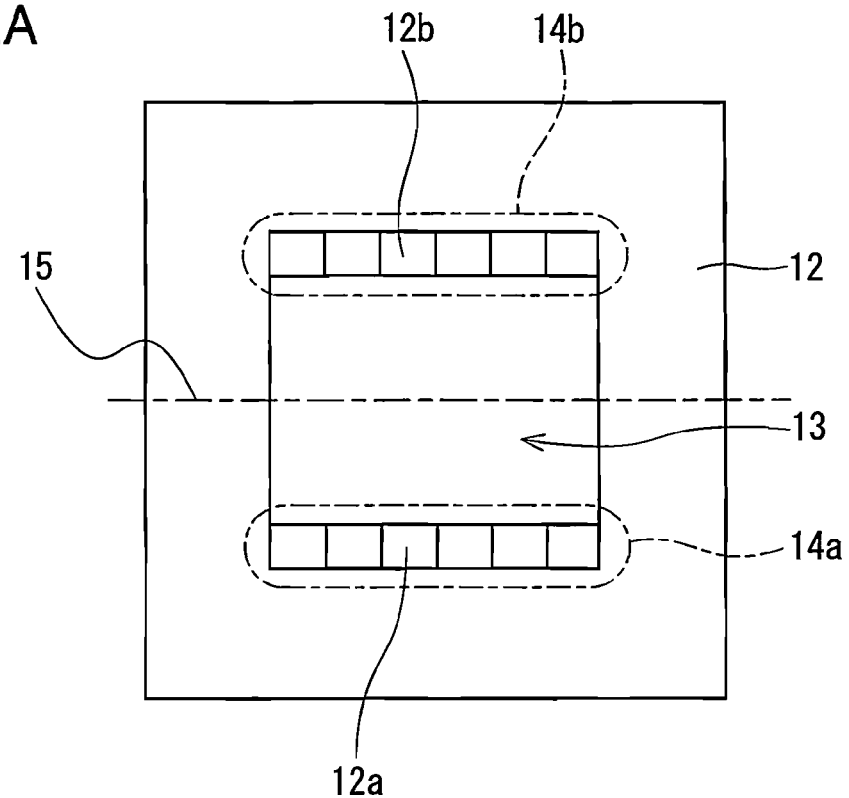
FIG. 2A is a plan view showing a support body constituting the ventilation member shown in FIG. 1A.
Figure 2B:
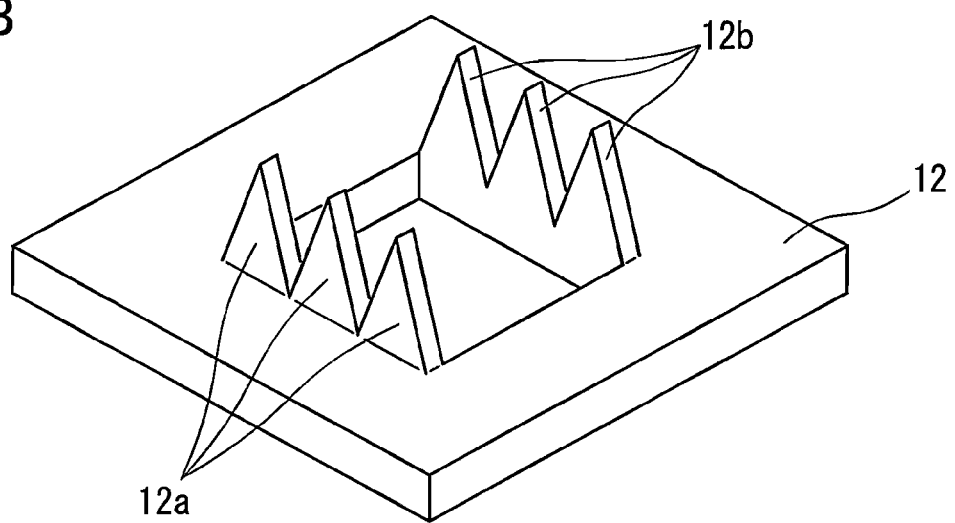
FIG. 2B is a perspective view of the support body shown in FIG. 2A.

The shape of the support body 12 is described with reference also to FIG. 2A and FIG. 2B. The support body 12 includes, at an edge of the opening closed by the gas permeable membrane 11, a first region 14a and a second region 14b facing each other with the opening located therebetween. A first angled protrusion 12a in which a peak and a trough are arranged alternately along the edge of the opening is provided in the first region 14a. A second angled protrusion 12b in which a peak and a trough are arranged alternately along the edge of the opening is provided in the second region 14b.

The gas permeable membrane 11 is joined onto the first angled protrusion 12a and the second angled protrusion 12b, and thus it has a pleat shape in which a peak and a trough are arranged alternately along shapes of the first angled protrusion 12a and the second angled protrusion 12b. The pleat shape may be determined so that an area for obtaining a necessary gas permeation quantity can be ensured in accordance with each application. The pleat shape is not particularly specified. As a standard, each peak has a height of about 0.2 to 100 mm. In accordance with the target pleat shape, the shapes of the first angled protrusion 12a and the second angled protrusion 12b of the support body 12 may be determined.

Usually, a gas permeable membrane used in a conventional ventilation member has a sheet-like shape. For example, as shown in FIG. 7A, in a conventional ventilation member 100, a sheet-like gas permeable membrane 101 is disposed so as to cover one opening of a through hole 103 provided in a support body 102. Thus, in the case where the ventilation member 100 is disposed in an orientation that causes the gas permeable membrane 101 to be parallel to a horizontal plane, there is a problem in that when a water droplet 200 is put on the gas permeable membrane 101 as shown in FIG. 7B, the water droplet 200 does not flow but stays there, and thus the gas permeation through the entire gas permeable area (S1 (see FIG. 7A)) is reduced by the amount of the gas permeation expected to be obtained through the area of the water droplet 200, decreasing the gas permeation quantity. There is even a possibility that the gas permeable membrane 101 has almost no gas permeability when the water droplet 200 on the gas permeable membrane 101 has a larger area.

To deal with such problems, the ventilation member 1 of the present embodiment has the above-mentioned configuration, and thereby even in the case where a water droplet is put on the gas permeable membrane 11 when the ventilation member 1 is disposed so that the gas permeable membrane 11 is parallel to a horizontal plane (so that a plane of the opening closed with the gas permeable membrane 11 is parallel to a horizontal plane), the ventilation member 1 can ensure a sufficient gas permeation quantity without significantly reducing the gas permeable area due to the water droplet covering the gas permeable membrane as in the case of using a conventional sheet-like gas permeable membrane. Furthermore, in the ventilation member 1, it is possible to increase the gas permeable area without increasing the attachment area because the gas permeable membrane 11 has a pleat shape. Therefore, a larger gas permeation quantity than that in the case of using a sheet-like gas permeable membrane can be obtained.

Preferably, the gas permeable membrane 11 has a shape that allows a water droplet put thereon to slide down to the troughs of the gas permeable membrane 11 along the inclination of the gas permeable membrane 11. Such a configuration can prevent the water droplet from covering the gas permeable membrane 11 because it allows the water droplet to slide down to the troughs of the gas permeable membrane 11 along the inclination of the gas permeable membrane 11. Moreover, since the both ends of the troughs of the gas permeable membrane 11 are open, the water droplets accumulated at the troughs can flow out from the both ends of the troughs. Thus, there is no such a case that the water droplets are accumulated on the gas permeable membrane 11 and cover the gas permeable membrane 11 completely. Therefore, the ventilation member 1 of the present embodiment can ensure a sufficient gas permeable area even when a water droplet is put on the gas permeable membrane 11.

Desirably, the gas permeable membrane 11 has an inclination angle that is larger than a water droplet falling angle by 5° or more so as to make it easier for the water droplet put thereon to slide down to the troughs of the gas permeable membrane 11. The gas permeable membrane 11 is joined onto the first angled protrusion 12a and the second angled protrusion 12b of the support body 12 and fits along the shapes of these protrusions 12a and 12b. Thus, the first angled protrusion 12a and the second angled protrusion 12b of the support body 12 are formed so that the gas permeable membrane 11 can achieve such an inclination angle.

Figure 3:
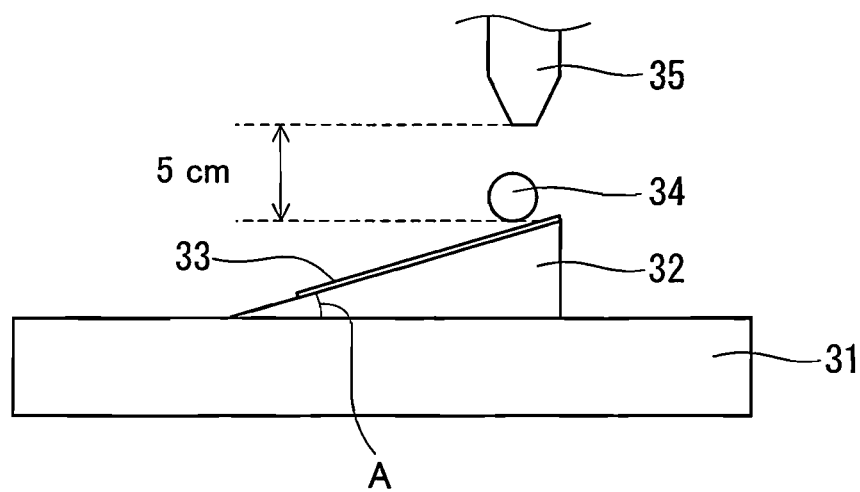
FIG. 3 is a diagram illustrating a method for measuring a water droplet falling angle.

When 1 $cm^3$ of distilled water is dropped, in an atmosphere at a temperature of 25° C., from a height of 5 cm on a surface of a sheet-like membrane made of the same material as that of the gas permeable membrane 11, the water droplet falling angle of the gas permeable membrane 11 is defined as a minimum value of an inclination angle, among inclination angles of the sheet-like membrane with respect to a horizontal plane, that allows a droplet of the distilled water to flow on the surface of the sheet-like membrane. As shown in FIG. 3, an inclined plane 32 having an angle A with respect to a horizontal table 31 is prepared, and a sheet-like membrane 33 made of the same material as that of the gas permeable membrane 11 is disposed thereon. 1 $cm^3$ of a distilled water droplet 34 is dropped on a surface of the sheet-like membrane 33 in this state from a height of 5 cm by using a liquid dropping jig (such as a dropper and a syringe) 35. While the angle A is being changed, the droplet 34 is dropped repeatedly, and the minimum value of the inclination angle that allows the droplet 34 to flow on the surface of the sheet-like membrane 33 is determined. This minimum value is defined as the water droplet falling angle of the gas permeable membrane 11.

The support body 12 in the present embodiment is described in further detail. In the present embodiment, the first angled protrusion 12a and the second angled protrusion 12b have shapes corresponding to each other with the opening located therebetween. More specifically, the first angled protrusion 12a and the second angled protrusion 12b have shapes that are line-symmetric to each other with respect to an intermediate axis 15 between the first region 14a and the second region 14b (see FIG. 2A). Since the first angled protrusion 12a and the second angled protrusion 12b have such a shape relationship, the gas permeable membrane 11 joined onto the protrusions 12a and 12b is less likely to be wrinkled and twisted, and water droplets are less likely to accumulate on the gas permeable membrane 11. In the present embodiment, the first angled protrusion 12a and the second angled protrusion 12b each have a shape with three peaks. However, the shape is not limited to this and it may include four or more peaks.

As the support body 12, there can be used injection-molded products that are made of various plastics and metal parts in which the first angled protrusion 12a and the second angled protrusion 12b are integrally formed altogether. As the material of the support body 12, a thermoplastic resin preferably is used from the viewpoint of moldability. For example, it is possible to use various thermoplastic elastomers such as an olefin elastomer, a styrene elastomer, an urethane elastomer, an ester elastomer, an amide elastomer, and a vinyl chloride elastomer, various thermoplastic resins such as polyolefin, polyamide, polyester, polyacetal, polysulfone, polyacryl, and polyphenylene sulfide, various rubbers such as chloroprene rubber, isoprene rubber, styrene butadiene rubber, and natural rubber, and composites of these. The material of the support body 12 may contain pigments such as carbon black and titanium white, reinforcing fillers such as glass particles and glass fibers, a water repellent material, etc.

The gas permeable membrane 11 is waterproof. Thus, a material with water repellency is used as the material of the gas permeable membrane 11. The material of the gas permeable membrane 11 is not particularly limited, but a polytetrafluoroethylene (hereinafter referred to as PTFE) porous membrane is used preferably to prevent water from penetrating into the gas permeable membrane 11 even when the gas permeable membrane 11 is splashed with rain water and to prevent the gas permeable membrane 11 from getting so much dirt when it is placed outdoors. The gas permeable membrane 11 may be formed of a PTFE porous membrane. The PTFE porous membrane can be produced by, for example, making a sheet-like PTFE formed body first, and stretching the body biaxially to make it porous.

In order to strengthen the gas permeable membrane 11, it is possible to bond a reinforcing layer to a resin porous membrane, such as a PTFE porous membrane, and a resultant product may be used as the gas permeable membrane 11. As the material of the reinforcing layer, a material having higher gas permeability than that of the resin porous membrane is used preferably. Specific examples thereof include a woven fabric, a nonwoven fabric, a mesh, a net, a sponge, a foam, and a porous body that are composed of a resin or metal. As the woven fabric, nonwoven fabric and net, there can be used, for example, polyolefin such as polyethylene and polypropylene, a synthetic fiber of polyamide, polyester, aromatic polyamide, acrylic resin, polyimide, or the like, and composites of these. As the method for joining the reinforcing layer to the resin porous membrane, there can be mentioned a method such as heat welding, ultrasonic welding, and bonding with an adhesive.

When the ventilation member 1 is used in an automobile component, etc., the gas permeable membrane 11 is possibly splashed with a window washer liquid, and oils such as engine oil and brake oil. Thus, a surface of the gas permeable membrane 11 may be treated with an oil repellent treatment to prevent even these liquids having a low surface tension from penetrating into the gas permeable membrane 11. It is possible to perform the oil repellent treatment by applying a material having a low surface tension to the gas permeable membrane 11, and drying and then curing the material. An oil repellent agent used for the oil repellent treatment is not limited as long as the agent makes it possible to form a coating having a lower surface tension than that of the gas permeable membrane 11. For example, an oil repellent agent containing a polymer having a perfluoroalkyl group is preferable. The oil repellent agent may be applied by impregnation, spraying, etc.

Preferably, the porous membrane used for the gas permeable membrane 11 has an average pore diameter of 0.01 μm or more and 10 μm or less from the viewpoint of ensuring sufficient gas permeability and sufficient waterproofness.

The gas permeable membrane 11 has a thickness of 1 to 5000 μm for example, preferably 5 to 2000 μm, and more preferably 10 to 500 μm. Preferably, the gas permeable membrane 11 has a gas permeability of 0.1 to 300 sec/100 cm$^3$ in Gurley value.

The ventilation member 1 is used as an internal pressure adjusting member in many cases. Thus, the gas permeable membrane 11 preferably has a level of water pressure resistance that prevents, even when a pressure difference occurs, water from being drawn into the gas permeable membrane 11 due to the pressure. Therefore, it is preferable that the gas permeable membrane 11 has a water pressure resistance of at least 0.5 kPa (50 mmH$_2$O). When the ventilation member 1 is used for a lighting appliance, the gas permeable membrane 11 preferably has a water pressure resistance of 1 kPa or more.

Next, an example of the method for producing the PTFE porous membrane is described.

First, a liquid lubricant is added to PTFE fine powder, and a resultant pasty mixture is preformed. The liquid lubricant is not particularly limited as long as it can wet the surface of the PTFE fine powder and can be removed by extraction or heating. For example, hydrocarbon, such as liquid paraffin, naphtha and white oil, can be used as the liquid lubricant. Preferably, the amount of the liquid lubricant to be added is about 5 to 50 parts by weight with respect to 100 parts by weight of the PTFE fine powder. The above-mentioned preforming is performed at a level of pressure that does not cause the liquid lubricant to be pressed out. Subsequently, a resultant preformed body is formed into a sheet-like shape by paste extrusion and roll-pressing. This PTFE formed body is stretched uniaxially or biaxially to obtain a PTFE porous membrane. The stretching conditions can be set as appropriate. For example, the temperature is 30 to 400° C. and the stretching factor is 1.5 to 200 in each direction. Preferably, a PTFE porous membrane that has not been sintered in the stretching process is sintered at a temperature equal to or higher than the melting point after the stretching.

The PTFE porous membrane thus produced, or the product obtained by bonding a gas permeable material to this PTFE porous membrane, has a sheet-like shape. Thus, the PTFE porous membrane or the product may be processed (pleated) in advance to have folding lines along the shapes of the first angled protrusion 12a and the second angled protrusion 12b provided to the support body 12. The folding lines can be made into this shape easily with various pleaters.

The gas permeable membrane 11 and the support body 12 can be joined to each other by, for example, bonding with a double-sided tape, bonding with various adhesives, bonding by a welding method such as heat welding, ultrasonic welding and laser joining, and bonding by an insert molding method.

The ventilation member 1 of the present embodiment can ensure a sufficient gas permeable area even when a water droplet is put on the gas permeable membrane 11. Also, in the ventilation member 1 of the present embodiment, since the gas permeable membrane 11 has a pleat shape, it is possible to increase the gas permeable area without increasing the attachment area, and thereby to achieve a large gas permeation quantity.

In the present embodiment, the first angled protrusion 12a and the second angled protrusion 12b of the support body 12 are rectilinear, and the gas permeable membrane 11 has a pleat shape with the folding lines formed along the shapes of the protrusions 12a and 12b. However, the present embodiment is not limited to this configuration. The same effects can be obtained also in the case where the first angled protrusion 12a and the second angled protrusion 12b each have a domed shape formed with a curved line, and the gas permeable membrane 11 has a wave shape along this shape.

Embodiment 2

With reference to FIG. 4A, FIG. 4B, FIG. 5A, and FIG. 5B, structural examples of a ventilation member in Embodiment 2 of the present invention are described. The ventilation member of the present embodiment is different from the ventilation member 1 of Embodiment 1 in that the support body has a shape to be fitted to an attachment portion of a housing to which the ventilation member is to be attached, that is, the support body has a shape that enables so-called one-touch attachment to the housing as a mating member. Since the rest of the configuration is the same as that of the ventilation member 1 of Embodiment 1, detailed description thereof is omitted in the present embodiment.

Figure 4A:
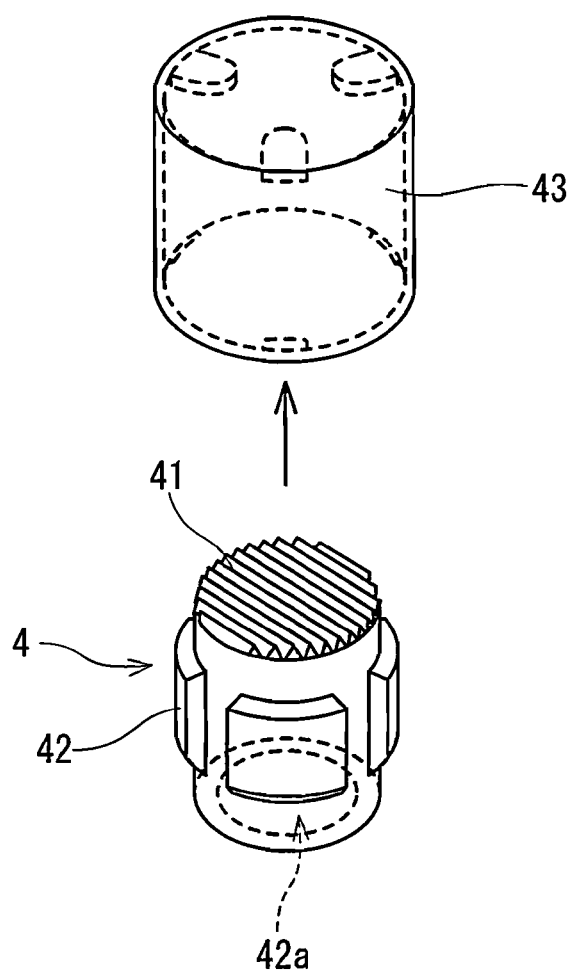
FIG. 4A is a perspective view showing a structural example of a ventilation member in Embodiment 2 of the present invention.
Figure 4B:
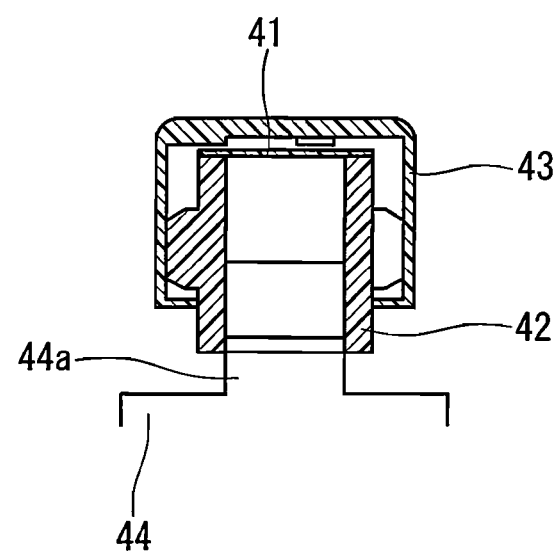
FIG. 4B is a cross-sectional view showing the ventilation member shown in FIG. 4A, the ventilation member being attached to a housing.

As shown in FIG. 4A, a ventilation member 4 of the present embodiment includes a waterproof gas permeable membrane 41, and a circular cylindrical support body 42 having a through hole 42a. One opening of the through hole 42a is closed by the gas permeable membrane 41. The ventilation member 4 further includes a cover 43 for covering the support body 42 from the side of the gas permeable membrane 41. As shown in FIG. 4B, the support body 42 has a shape that allows the other opening of the through hole 42a, which is not closed with the gas permeable membrane 41, to fit to a nozzle (attachment portion) 44a of a housing 44 to which the ventilation member 4 is to be attached. The support body 42 is made of a material having elasticity, and the support body 42 is fixed to the nozzle 44a of the housing 44 by utilizing this elasticity.

Although not illustrated in details, the support body 42 is provided with, at an edge of the opening closed by the gas permeable membrane 41, the first angled protrusion and the second angled protrusion, like the support body 12 of Embodiment 1. Joined onto these protrusions, the gas permeable membrane 41 has a pleat shape or a wave shape, like the gas permeable membrane 11 of Embodiment 1. The shape and the material of the gas permeable membrane 41 are the same as those of the gas permeable membrane 11 of Embodiment 1.

Figure 5A:
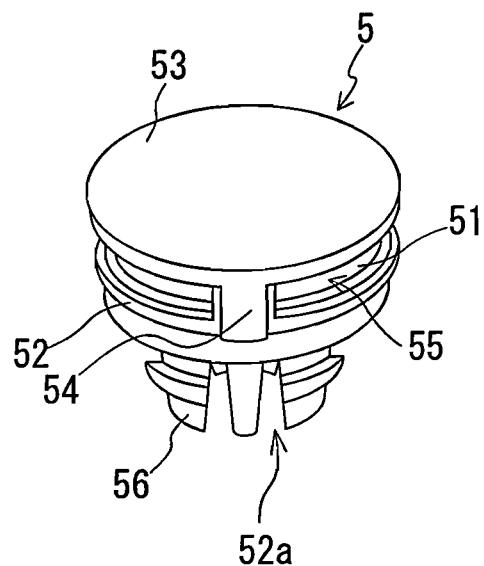
FIG. 5A is a perspective view showing another structural example of the ventilation member in Embodiment 2 of the present invention.
Figure 5B:
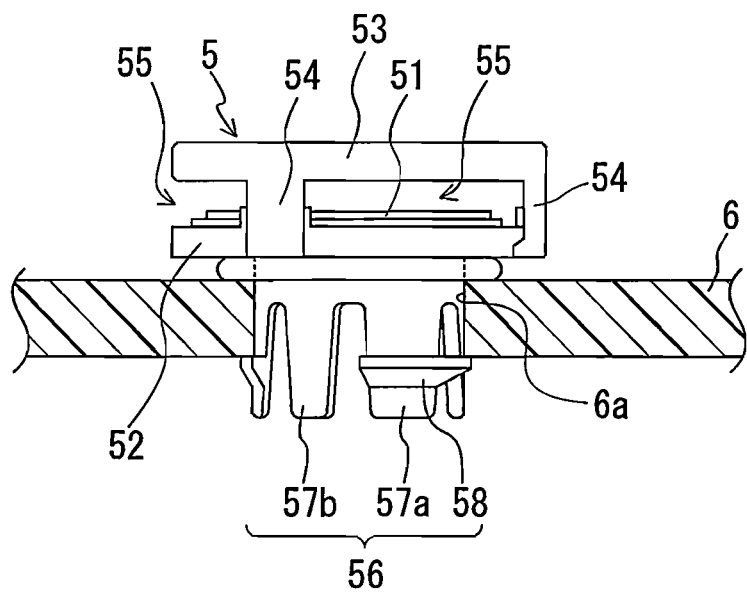
FIG. 5B is a cross-sectional view showing the ventilation member shown in FIG. 5A, the ventilation member being attached to a housing.

Another example of the configuration that enables the one-touch attachment is also described. A ventilation member 5 shown in FIG. 5A includes a waterproof gas permeable membrane 51, and a circular cylindrical support body 52 having a through hole 52a. One opening of the through hole 52a is closed by the gas permeable membrane 51. The ventilation member 5 further includes a cover 53 disposed so as to cover the gas permeable membrane 51, and a side wall 54 that supports the cover 53 against the support body 52. A vent opening 55 through which the gas to permeate or having permeated through the gas permeable membrane 51 is introduced or discharged is provided between the gas permeable membrane 51 and the covers 53, on a side surface of the ventilation member 5. The support body 52 includes a portion (insert part 56) to be inserted, as shown in FIG. 5B, into an opening part (attachment portion) 6a of a housing 6 to which the ventilation member 5 is to be attached. The support body 52 has a shape that allows the insert part 56 to be fitted to the opening part 6a of the housing 6. In this example, the insert part 56 is divided into six legs along the circumferential direction, and each of three legs 57a out of the six divided legs has a securing part 58 at an edge on its insertion starting side. The legs 57a having the securing part 58 and legs 57b that do not have the securing part 58 are arranged alternately. When the insert part 56 thus configured is inserted into the opening part 6a of the housing 6, the securing parts 58 are fitted to an edge of the opening part 6a on the inner side of the housing as shown in FIG. 5B. Thereby, the ventilation member 5 can be fixed to the housing 6.

Although not illustrated in details, the support body 52 is provided with, at an edge of the opening closed by the gas permeable membrane 51, the first angled protrusion and the second angled protrusion, like the support body 12 of Embodiment 1. Joined onto these protrusions, the gas permeable membrane 51 has a pleat shape or a wave shape like the gas permeable membrane 11 of Embodiment 1. The shape and the material of the gas permeable membrane 51 are the same as those of the gas permeable membrane 11 of Embodiment 1.

The ventilation members 4 and 5 of the present embodiment can achieve the same effects as those of the ventilation member 1 of Embodiment 1 because they have the same characteristics as those of the ventilation member 1 of Embodiment 1.

Embodiment 3

Figure 8:
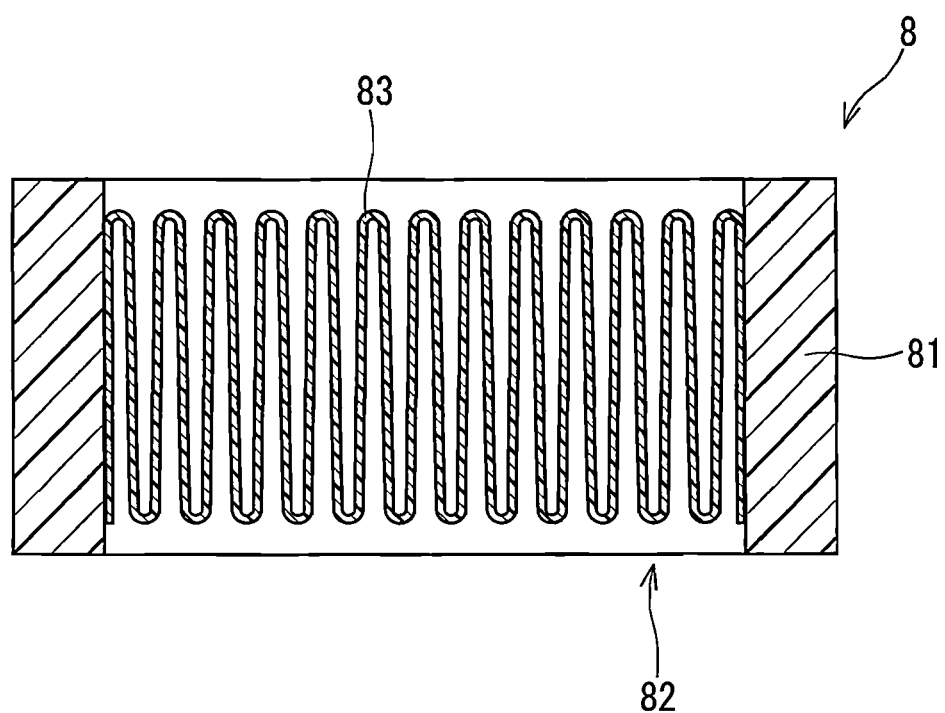
FIG. 8 is a cross-sectional view showing one structural example of a ventilation member in Embodiment 3 of the present invention.

FIG. 8 is a cross-sectional view showing one structural example of a ventilation member 8 in Embodiment 3 of the present invention. The ventilation member 8 shown in FIG. 8 includes a support body 81 having a through hole 82, and a gas permeable membrane 83 disposed inside the through hole 82. In the present embodiment, the support body 81 is a cylindrical body. The through hole 82 of the support body 81 serves as a gas passage to the inside and outside of a housing when the ventilation member 8 is attached to the housing. The gas permeable membrane 83 is joined to an inner wall surface of the through hole so as to close the through hole 82, and has a pleat shape. That is, the gas permeable membrane 83 is accommodated inside the through hole 82 of the support body 81 while being folded in a pleat shape.

Desirably, sealing is provided between a periphery of the gas permeable membrane 83 and the inner wall surface of the through hole of the support body 81. The sealing between the gas permeable membrane 83 and the support body 81 can be achieved through bonding by an insert molding method, fixing with an adhesive, fixing by crimping, and a welding technique.

The material that can be used as the material of the support body 81 is the same as the material of support body 12 described in Embodiment 1. When the gas permeable membrane 83 is joined to the support body 81 through the bonding by an insert molding method or the welding, a thermoplastic resin is used preferably. When the gas permeable membrane 83 is joined to the support body 81 through the fixing with an adhesive or the fixing by crimping, a thermosetting resin, such as ethylene-propylene-diene rubber (EPDM) and silicone rubber, or metal is used preferably.

The configuration and material of a membrane that can be used as the gas permeable membrane 83 are the same as those of the gas permeable membrane 11 described in Embodiment 1. The gas permeable membrane 83 may be treated with an oil repellent treatment in the same manner as the gas permeable membrane 11.

Figure 9:
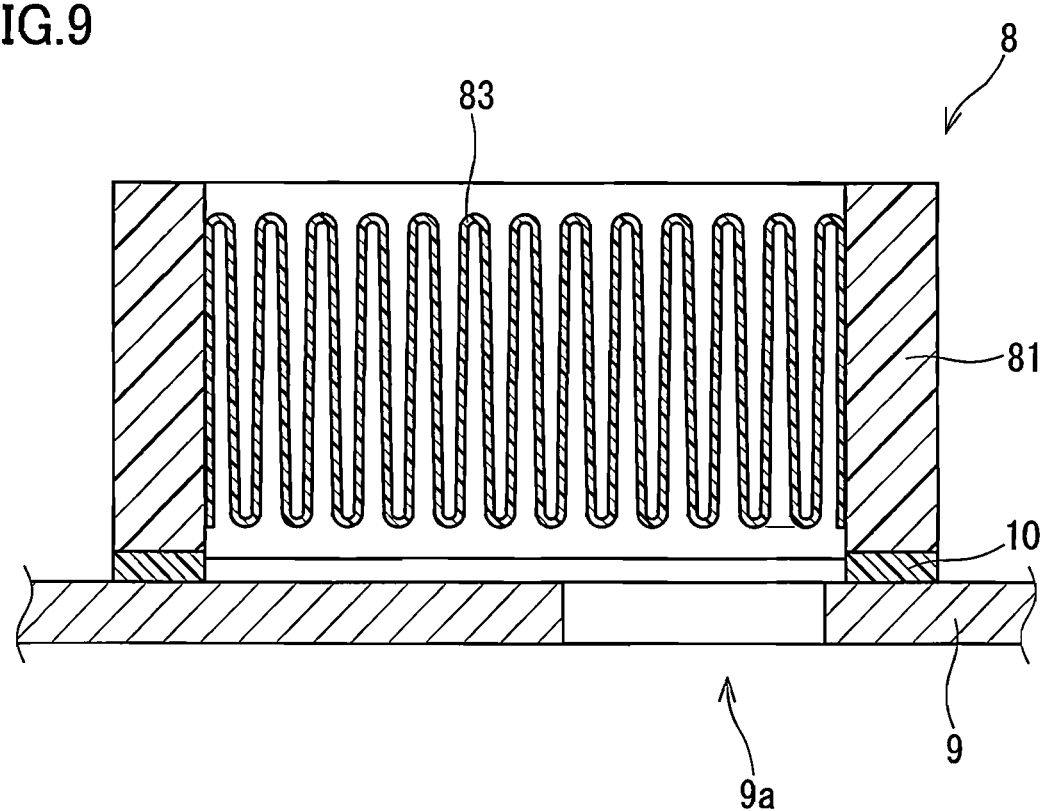
FIG. 9 is a cross-sectional view showing the ventilation member in Embodiment 3 of the present invention, the ventilation member being attached to a housing.

FIG. 9 shows the ventilation member 8 shown in FIG. 8 that is attached to the housing. A housing 9 has an attachment hole 9a. The ventilation member 8 is joined to the housing 9 by a bonding means such as a double-sided adhesive tape 10. The attachment hole 9a of the housing 9 is smaller than the through hole 82 of the support body 81 of the ventilation member 8, and the size and shape thereof are not particularly limited. Such an attachment method is an easy method applicable to any housings.

Examples of the method for joining the ventilation member 8 to the housing 9 include ultrasonic welding, heat welding, and laser welding.

Figure 10A:
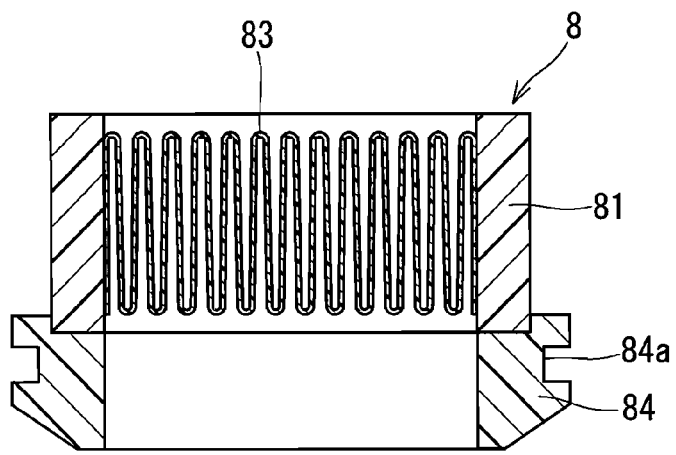
FIG. 10A is a cross-sectional view showing another structural example of the ventilation member in Embodiment 3 of the present invention.
Figure 10B:
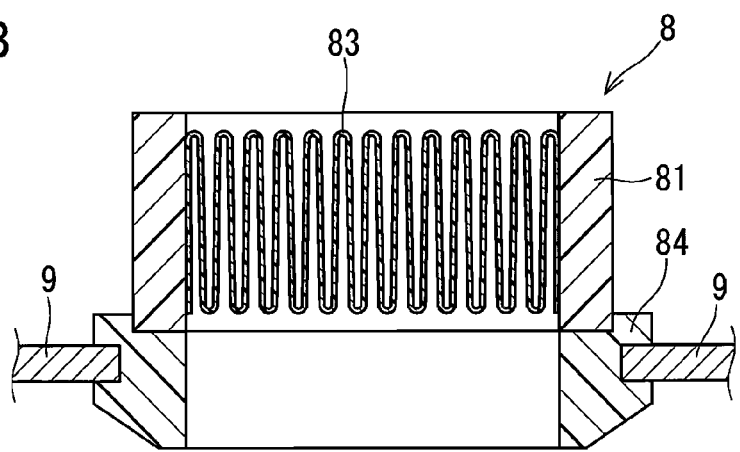
FIG. 10B is a cross-sectional view showing one example of the ventilation member shown in FIG. 10A, the ventilation member being attached to a housing.
Figure 10C:
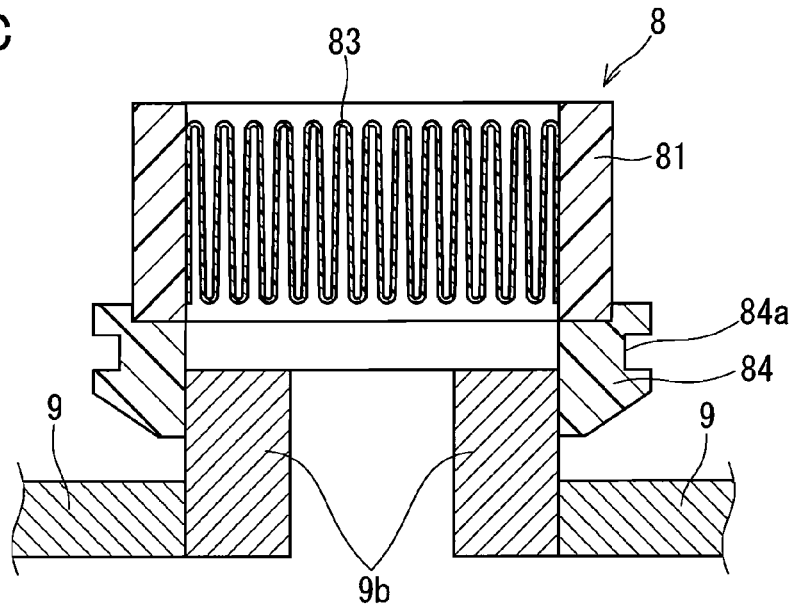
FIG. 10C is a cross-sectional view showing another example of the ventilation member shown in FIG. 10A, the ventilation member being attached to a housing.

FIG. 10A shows another example of the ventilation member 8 of the present embodiment. The ventilation member 8 shown in FIG. 10A has an attachment part 84 with a shape to be fitted to an attachment portion of a housing to which the ventilation member 8 is to be attached. In the present embodiment, the attachment part 84 is provided at the end of the support body 81 that is on the housing side when the ventilation member 8 is attached to the housing. The attachment part 84 includes a portion (insert part 84a) to be inserted, as shown in FIG. 10B, into an edge of an opening (attachment portion) of the housing 9 to which the ventilation member 8 is attached. The insert part 84a has a shape to be fitted to the edge of the opening of the housing 9. Furthermore, for the case where the attachment portion of the housing 9 to which the ventilation member 8 is to be attached is a nozzle, the attachment part 84 also has a shape to be fitted to the nozzle. Thus, even when the attachment portion of the housing 9 is a nozzle 9b, the attachment part 84 can be fitted to the nozzle 9b as shown in FIG. 10C. The attachment part 84 is made of a material having elasticity, and the support body 81 is fixed to the housing by utilizing this elasticity. Such a configuration enhances the close bonding reliability between the ventilation member 8 and the housing 9. Although the attachment part 84 shown in FIG. 10A has a configuration applicable in both cases where the attachment portion of the housing is an opening and where it is a nozzle, the insert part 84a is not necessary when the attachment portion of the housing is a nozzle, for example.

Figure 11:
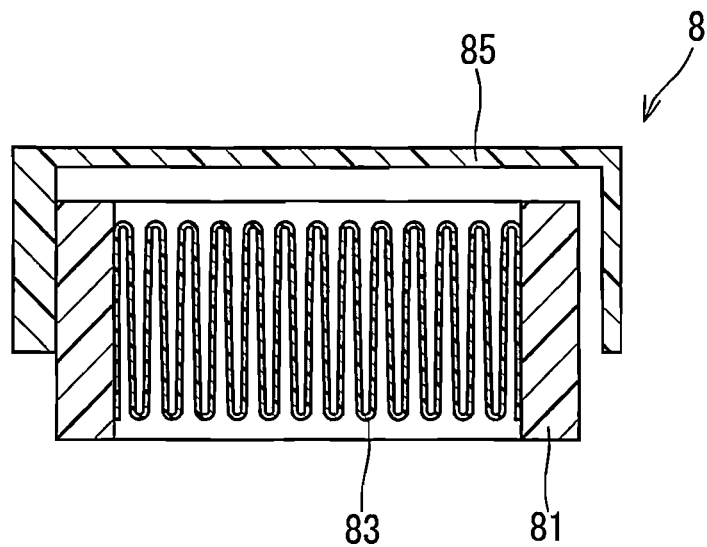
FIG. 11 is a cross-sectional view showing still another structural example of the ventilation member in Embodiment 3 of the present invention.

FIG. 11 shows another example of the ventilation member 8 of the present embodiment. In the ventilation member 8 shown in FIG. 11, the support body 81 includes a cover part 85 for protecting the gas permeable membrane 83. The cover part 85 is provided so as to protect a surface of the gas permeable membrane 83 that faces toward an outside of the housing when the ventilation member 8 is attached to the housing. Thereby, the gas permeable membrane 83 can be protected, and the reliability is enhanced accordingly.

Figure 12:
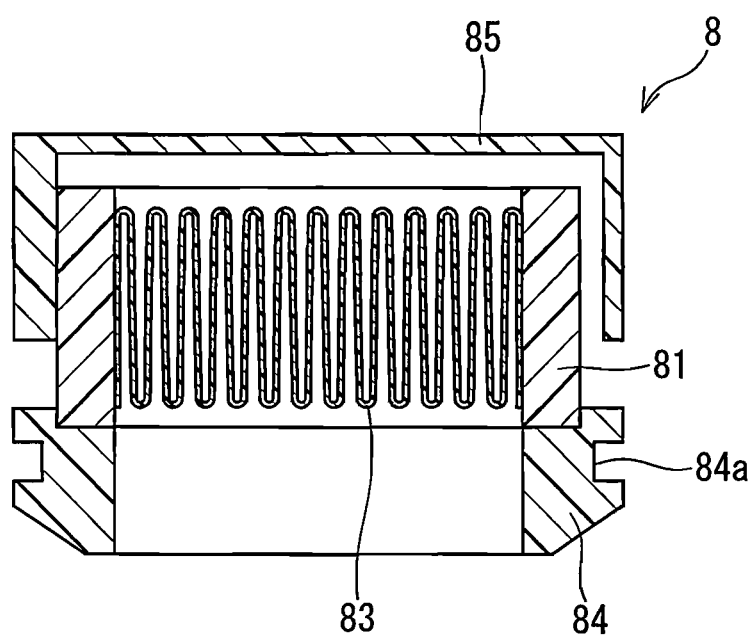
FIG. 12 is a cross-sectional view showing still another structural example of the ventilation member in Embodiment 3 of the present invention.

As shown in FIG. 12, the support body 81 may include both of the attachment part 84 and the cover part 85.

Figure 13:
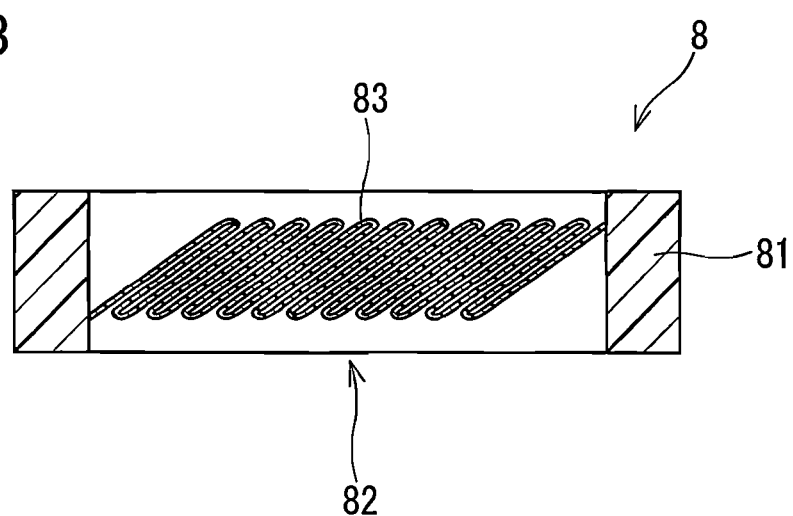
FIG. 13 is a cross-sectional view showing still another structural example of the ventilation member in Embodiment 3 of the present invention.

FIG. 13 shows another example of the ventilation member 8 of the present embodiment. As shown in FIG. 13, in the ventilation member 8, the gas permeable membrane 83 is disposed inside the through hole 82 so that the gas permeable membrane 83 folded in a pleat shape is slanted laterally, that is, the angle between the inclined surfaces of the pleats and the height direction of the through hole 82 of the support body 81 is increased. Such a configuration makes it possible to reduce further the size of the ventilation member 8. Moreover, the ventilation member 8 shown in FIG. 13 can include further the attachment part 84 and the cover part 85 shown respectively in FIG. 10A and FIG. 11.

EXAMPLES

Next, the ventilation member of the present invention is described in detail with reference to examples. The present invention is not limited by the following examples at all.

A pasty mixture obtained by adding 19 parts by weight of a liquid lubricant (normal decane) to 100 parts by weight of PTFE fine powder (trade name F104, produced by Daikin Industries Ltd.) was preformed and formed into the shape of a round bar by paste extrusion. The formed product was roll-pressed to have a thickness of 0.2 mm, and then the liquid lubricant was removed therefrom in a drying furnace at 150° C. A resultant sheet was stretched in the length direction by a factor of 2 at 280° C. Thereafter, the sheet was stretched further by a factor of 4 at a temperature of 360° C. The sheet was stretched further in the width direction by a factor of 5 in 100° C. atmosphere. Thus, a PTFE membrane was obtained. This was referred to as a gas permeable membrane A.

The PTFE membrane obtained by the above-mentioned method was dip-coated with an undiluted water repellent agent (Adesso WR-1, produced by Nicca Chemical Co., Ltd.), and then dried at 60° C. for 1 minute. A resultant membrane was referred to as a gas permeable membrane B.

The gas permeable membrane A and the gas permeable membrane B each had a thickness of 80 μm. The gas permeable membrane A and the gas permeable membrane B each had a water pressure resistance of 30 kPa (3000 mmH$_2$O) as measured by a method according to JIS L1092 B. The gas permeable membrane A had a gas permeation quantity of 1.5 seconds/100 cc and the gas permeable membrane B had a gas permeation quantity of 2 seconds/100 cc, as measured by Gurley method according to JIS P8117.

The gas permeable membrane A and the gas permeable membrane B were measured for water droplet falling angle by the method described in Embodiment 1. The gas permeable membrane A had a water droplet falling angle of 50°, and the gas permeable membrane B had a water droplet falling angle of 40°.

Figure 6A:
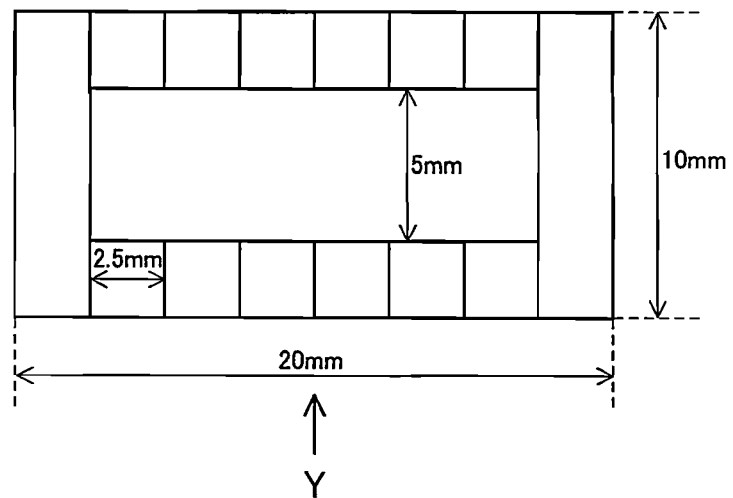
FIG. 6A is a plan view showing the shape of a support body used in Example.
Figure 6B:
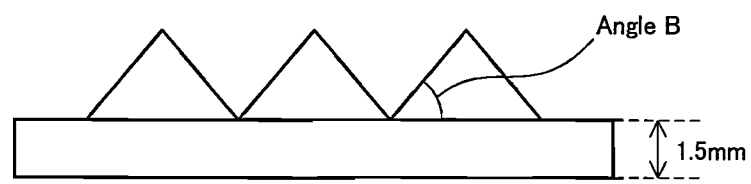
FIG. 6B is a side view of the support body shown in FIG. 6A, viewed from the Y direction.

As the support body, a molded product having the shape shown in FIG. 6A and FIG. 6B and obtained by injection molding was used. The resin used was a PP resin "Funcster LR23C" produced by Japan Polypropylene Corp. FIG. 6A shows a plan view of the support body. FIG. 6B shows a side view of the support body shown in FIG. 6A, viewed from the Y direction. The support bodies to which the angled protrusions were provided at an inclination angle B (see FIG. 6B) of 0°, 30°, 40°, 45°, 50° and 60°, respectively, were produced. The gas permeable membrane A or the gas permeable membrane B was bonded to the edge of the opening of each support body by a heat welding method. Thereby, ventilation member samples in each of which the gas permeable membrane A or the gas permeable membrane B had a pleat shape with an inclination angle of 0°, 30°, 40°, 45°, 50° or 60° were obtained.

1 cm$^3$ of distilled water was dropped on the surface of the gas permeable membrane of each sample from a height of 5 cm with a dropper to see whether the water flows or not. Also, each sample was measured for gas permeation quantity. Table 1 shows the results. Furthermore, each sample was measured for gas permeation quantity by Gurley method according to JIS P8117. Table 1 also shows the results thereof.

TABLE 1

| Angle B | 0° | 30° | 40° | 45° | 50° | 60° |
|---|---|---|---|---|---|---|
| | Gas permeable membrane A (water droplet falling angle: 50°) | | | | | |
| Gas permeation quantity (second/100 cc) | 14 | 13 | 11 | 10 | 9 | 7 |
| Water droplet drop test results | Not flowed | Not flowed | Not flowed | Not flowed | Not flowed | Flowed |
| | Gas permeable membrane B (water droplet falling angle 40°) | | | | | |
| Gas permeation quantity (second/100 cc) | 17 | 15 | 13 | 12 | 11 | 9 |
| Water droplet drop test results | Not flowed | Not flowed | Not flowed | Flowed | Flowed | Flowed |

Each gas permeable membrane A and gas permeable membrane B was able to ensure a larger gas permeable area and thus to achieve a larger gas permeation quantity in the case where the support body was provided with the angled protrusion so that the membrane had a pleat shape (the angle B=30°, 40°, 45°, 50° or 60°) than in the case where the membrane had a conventional sheet-like shape (the angle B=0°). Furthermore, when the angle B was increased to be larger than the water droplet falling angle by 5° or more, a dropped water droplet flowed on the surface of each gas permeable membrane A and gas permeable membrane B. This result reveals that when the gas permeable membrane has a plane inclined at an angle that is larger than the water droplet falling angle by 5° or more, the water droplet on the gas permeable membrane flows easily to the trough of the gas permeable membrane, thereby making it possible to achieve a ventilation member in which the decrease of the gas permeation quantity can be suppressed more reliably.

INDUSTRIAL APPLICABILITY

The ventilation member of the present invention is waterproof and can ensure a sufficient gas permeation quantity even when a water droplet is put on the gas permeable membrane. Therefore, it can be used also in components and devices to which a water droplet may adhere, particularly in an automobile lamp, etc. in which a lamp lens surface is fogged with water condensation.

The invention claimed is:
1. A ventilation member comprising:
a waterproof gas permeable membrane; and
a support body having a through hole, one opening of the through hole being closed by the gas permeable membrane, wherein
the support body includes, at an edge of the opening closed by the gas permeable membrane, a first region and a second region facing each other with the opening located therebetween,
a first angled protrusion in which a peak and a trough are arranged alternately along the edge of the opening is provided in the first region, and a second angled protru- sion in which a peak and a trough are arranged alternately along the edge of the opening is provided in the second region, the gas permeable membrane is joined onto the first angled protrusion and the second angled protrusion, and has a pleat shape or a wave shape in which a peak and a trough are arranged alternately along shapes of the first angled protrusion and the second angled protrusion, and both ends of the trough of the gas permeable membrane are open to permit water flow from the gas permeable membrane surface.

2. The ventilation member according to claim 1, wherein the first angled protrusion and the second angled protrusion have shapes that are line-symmetric to each other with respect to an intermediate axis between the first region and the second region.

3. The ventilation member according to claim 1, wherein defining that when 1 cm$^3$ of distilled water is dropped, in an atmosphere at a temperature of 25° C., from a height of 5 cm on a surface of a sheet-like membrane made of the same material as that of the gas permeable membrane, a minimum value of an inclination angle, among inclination angles of the sheet-like membrane with respect to a horizontal plane, that allows a droplet of the distilled water to flow on the surface of the sheet-like membrane is a water droplet falling angle of the gas permeable membrane, one peak of the gas permeable membrane has an inclination angle, with respect to a plane including the opening of the support body, that is larger than the water droplet falling angle of the gas permeable membrane by 5° or more.

4. The ventilation member according to claim 1, wherein the gas permeable membrane is pleated.

5. The ventilation member according to claim 1, wherein a surface of the gas permeable membrane is treated with an oil repellent treatment.

6. The ventilation member according to claim 1, wherein the gas permeable membrane includes a polytetrafluoroethylene porous membrane.

7. The ventilation member according to claim 1, wherein the gas permeable membrane has a water pressure resistance of 1 kPa or more and the ventilation member is used for a lighting appliance.

8. The ventilation member according to claim 1, wherein the support body has a shape to be fitted to an attachment portion of a housing to which the ventilation member is to be attached.

9. The ventilation member according to claim 1, wherein
the support body includes a cover part for protecting the gas permeable membrane, and
the cover part protects a surface of the gas permeable membrane that faces toward an outside of the housing when the ventilation member is attached to the housing.

* * * * *